(12) United States Patent
Yang et al.

(10) Patent No.: US 10,825,811 B2
(45) Date of Patent: Nov. 3, 2020

(54) GATE CUT FIRST ISOLATION FORMATION WITH CONTACT FORMING PROCESS MASK PROTECTION

(71) Applicant: GLOBALFOUNDRIES INC., Grand Cayman (KY)

(72) Inventors: Xiaoming Yang, Ballston Lake, NY (US); Sipeng Gu, Clifton Park, NY (US); Jeffrey Chee, Ballston Lake, NY (US); Keith H. Tabakman, Gansevoort, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/280,343

(22) Filed: Feb. 20, 2019

(65) Prior Publication Data

US 2020/0266286 A1    Aug. 20, 2020

(51) Int. Cl.
*H01L 27/092* (2006.01)
*H01L 29/66* (2006.01)
(Continued)

(52) U.S. Cl.
CPC ........ *H01L 27/092* (2013.01); *H01L 21/0217* (2013.01); *H01L 21/31144* (2013.01); *H01L 21/76224* (2013.01); *H01L 21/76843* (2013.01); *H01L 21/76865* (2013.01); *H01L 21/823437* (2013.01); *H01L 21/823481* (2013.01);
(Continued)

(58) Field of Classification Search
CPC ............. H01L 27/0886; H01L 28/0924; H01L 21/76224–76237; H01L 21/823481; H01L 21/823878; H01L 21/762; H01L 29/0649; H01L 29/0653; H01L 21/0217; H01L 21/02247; C23C 14/0641–0658; C23C 16/34–347; C23C 16/36; C23C 14/0676; C23C 16/308; C01B 21/06–0768; C01B 21/068–0687; C01B 21/076–0768
See application file for complete search history.

(56) References Cited

U.S. PATENT DOCUMENTS 9,064,932 B1    6/2015  Pham et al.
9,293,459 B1    3/2016  Cheng et al.
(Continued)

OTHER PUBLICATIONS

U.S. Appl. No. 15/917,940, filed Mar. 12, 2018, currently allowed.

*Primary Examiner* — Scott B Geyer
(74) *Attorney, Agent, or Firm* — Francois Pagette; Hoffman Warnick LLC

(57) ABSTRACT

A method, FET structure and gate cut structure are disclosed. The method forms a gate cut opening in a dummy gate in a gate material layer, the gate cut opening extending into a space separating a semiconductor structures on a substrate under the gate material layer. A source/drain region is formed on the semiconductor structure(s), and a gate cut isolation is formed in the gate cut opening. The gate cut isolation may include an oxide body. During forming of a contact, a mask has a portion covering an upper end of the gate cut isolation to protect it. The gate cut structure includes a gate cut isolation including a nitride liner contacting the end of the first metal gate conductor and the end of the second metal gate conductor, and an oxide body inside the nitride liner.

18 Claims, 7 Drawing Sheets

(51) Int. Cl.
*H01L 29/423* (2006.01)
*H01L 29/06* (2006.01)
*H01L 21/768* (2006.01)
*H01L 21/8234* (2006.01)
*H01L 21/311* (2006.01)
*H01L 21/762* (2006.01)
*H01L 21/02* (2006.01)

(52) U.S. Cl.
CPC .... *H01L 29/0653* (2013.01); *H01L 29/42372* (2013.01); *H01L 29/66545* (2013.01)

(56) References Cited

U.S. PATENT DOCUMENTS

| | | |
|---|---|---|
| 9,431,399 B1 | 8/2016 | Alptekin et al. |
| 9,812,365 B1 | 11/2017 | Zhang et al. |
| 2013/0049125 A1 | 2/2013 | Zhong et al. |
| 2016/0056181 A1* | 2/2016 | Anderson ............ H01L 27/1211 257/347 |
| 2016/0351563 A1* | 12/2016 | Chen ................ H01L 21/823437 |
| 2016/0365424 A1 | 12/2016 | Basker et al. |
| 2017/0018628 A1 | 1/2017 | Greene et al. |
| 2017/0154966 A1* | 6/2017 | Huang .................. H01L 29/401 |
| 2017/0154967 A1* | 6/2017 | Huang ................ H01L 21/0217 |
| 2018/0315752 A1* | 11/2018 | Fan ................ H01L 21/823437 |
| 2019/0157387 A1* | 5/2019 | Wu ................ H01L 21/823431 |
| 2019/0164838 A1* | 5/2019 | Chang ................ H01L 27/0886 |
| 2019/0244865 A1* | 8/2019 | Xu ..................... H01L 27/0207 |

\* cited by examiner

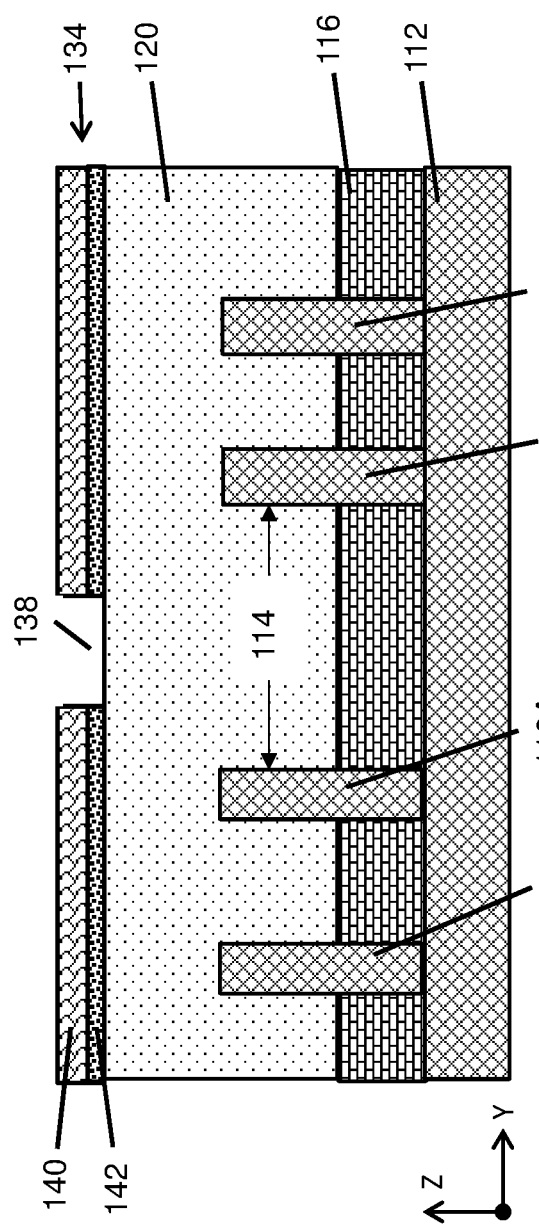
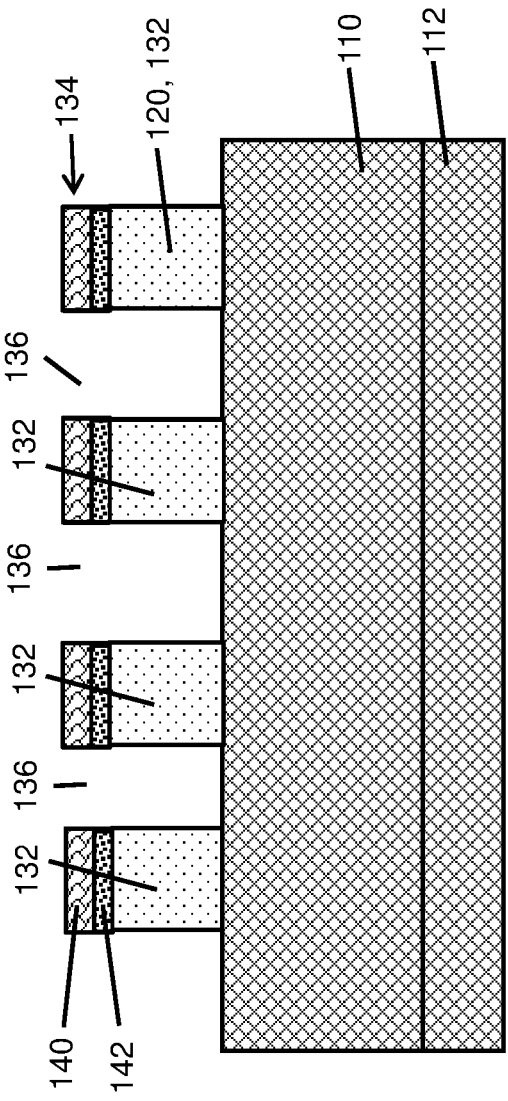
FIG. 2
FIG. 3

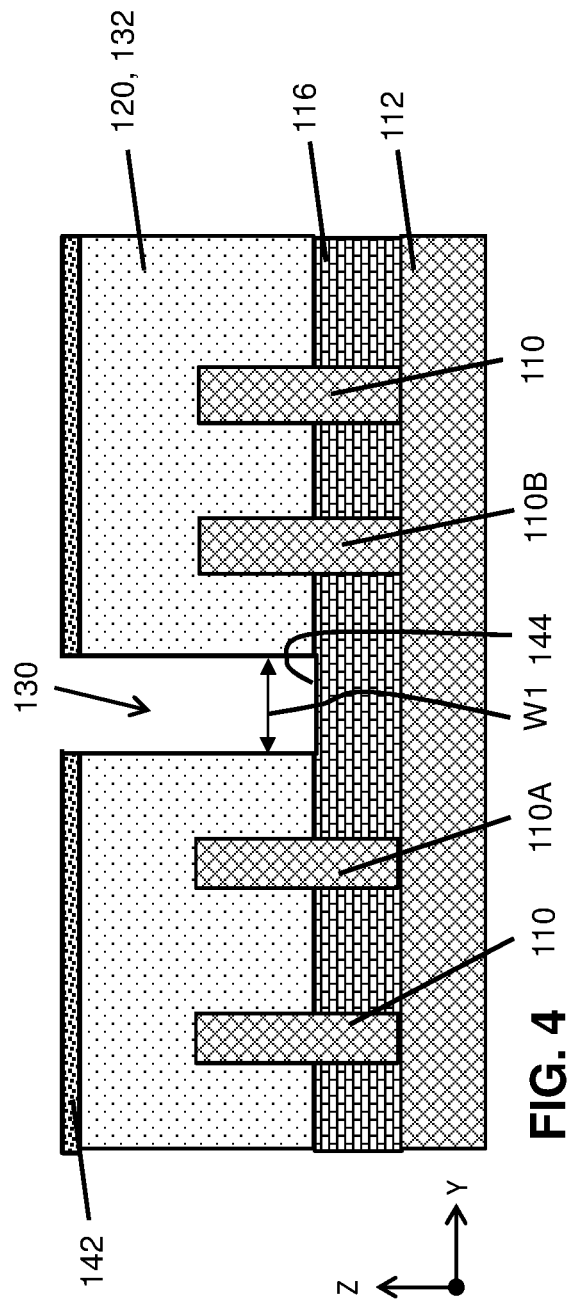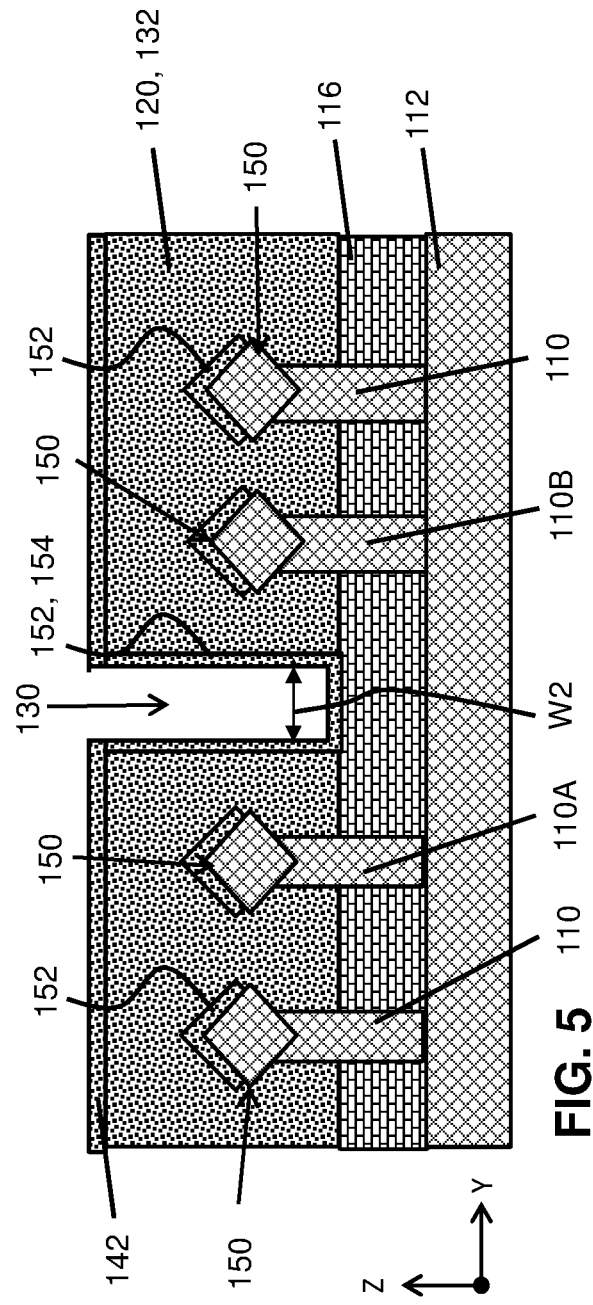

GATE CUT FIRST ISOLATION FORMATION WITH CONTACT FORMING PROCESS MASK PROTECTION

BACKGROUND

The present disclosure relates to integrated circuit (IC) formation, and more specifically, to a method of forming a gate cut isolation in which the gate cut opening is formed immediately after gate formation and is protected using a portion of a contact forming process mask. A resulting FET structure and gate cut structure are also disclosed.

Field effect transistor (FETs) are formed by creating a number of semiconductor structures on a substrate and placing a gate conductor across the semiconductor structures. A FET is created by the gate forming a channel region below the gate in the semiconductor structure, and source/drain regions formed in the semiconductor structure aside the gate. In order to form the various portions of the FET according to replacement metal gate (RMG) approach, an elongated dummy gates are put in place where the metal gate conductor will eventually be placed perpendicularly across the semiconductor structures. The dummy gate allows for processing such as anneals to be carried out without damaging the final gate conductor material. As part of the gate formation process, a gate cut opening is formed in the dummy gate, and is then filled with a nitride gate cut fill. To form the FETs, the dummy gates are removed, and replaced with a metal gate conductor that extends over adjacent semiconductor structures. The gate cut fill creates a structure that provides an electrical isolation between metal gate conductors of adjacent FETs to electrically isolate the FETs. Formation of contacts to the gates and source/drains follows.

As integrated circuit (IC) fabrication continues to scale to smaller technology nodes, e.g., 7 nanometers and beyond, spacing between structures continues to decrease. A particular challenge with forming the gate cut opening is creating the opening with the desired size, e.g., less than 30 nanometers (nm), and allowing sufficient space to remove any residue from the opening. At the 7 nm technology node and beyond, the amorphous silicon or polysilicon, and the nitride liner pinch off in a narrow gate cut opening, making it very difficult to remove the amorphous silicon or polysilicon residue at the bottom of the opening with the conventional reactive ion etch (RIE). The use of nitride for the gate cut isolation can also create residue during etching that can block other etching processes during subsequent interconnect formation.

SUMMARY

A first aspect of the disclosure is directed to a method, comprising: forming a gate cut opening in a gate structure in a gate material layer, the gate cut opening extending into a space separating a first and second semiconductor structure on a substrate under the gate material layer; forming a source/drain region on at least one of the first and second semiconductor structures; forming a gate cut isolation in the gate cut opening; and forming a contact to at least one of the source/drain regions, the contact forming including using a mask having a portion covering an upper end of the gate cut isolation.

A second aspect of the disclosure includes a field effect transistor (FET) structure, comprising: a substrate; a first FET on the substrate, the first FET having a first semiconductor structure and a first metal gate conductor over the first semiconductor structure; a second FET on the substrate, the second FET having a second semiconductor structure and a second metal gate conductor over the second semiconductor structure; and a gate cut structure electrically isolating an end of the first metal gate conductor of the first FET from an end of the second metal gate conductor of the second FET, wherein the gate cut structure includes: a nitride liner contacting the end of the first metal gate conductor and the end of the second metal gate conductor, and an oxide body inside the nitride liner.

A third aspect of the disclosure related to a gate cut structure for field effect transistors (FETs), the gate cut structure comprising: a gate cut isolation electrically isolating an end of a first metal gate conductor of a first FET from an end of a second metal gate conductor of a second FET, wherein the gate cut isolation includes a nitride liner contacting the end of the first metal gate conductor and the end of the second metal gate conductor, and an oxide body inside the nitride liner.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 2 shows a cross-sectional view along cross-section view line X1-X1 in FIG. 1 of forming a gate material layer, according to embodiments of the disclosure.

FIG. 3 shows a cross-sectional view along cross-section view line Y-Y in FIG. 1 of forming dummy gates, according to embodiments of the disclosure.

FIG. 4 shows a cross-sectional view along cross-section view line X1-X1 in FIG. 1 of forming a gate cut opening, according to embodiments of the disclosure.

FIG. 5 shows a cross-sectional view along cross-section view line X2-X2 in FIG. 1 of forming source/drain regions and a nitride liner in the gate cut opening, according to embodiments of the disclosure.

FIG. 9 also shows a FET structure and a gate cut structure, according to embodiments of the disclosure.

Figure 1:
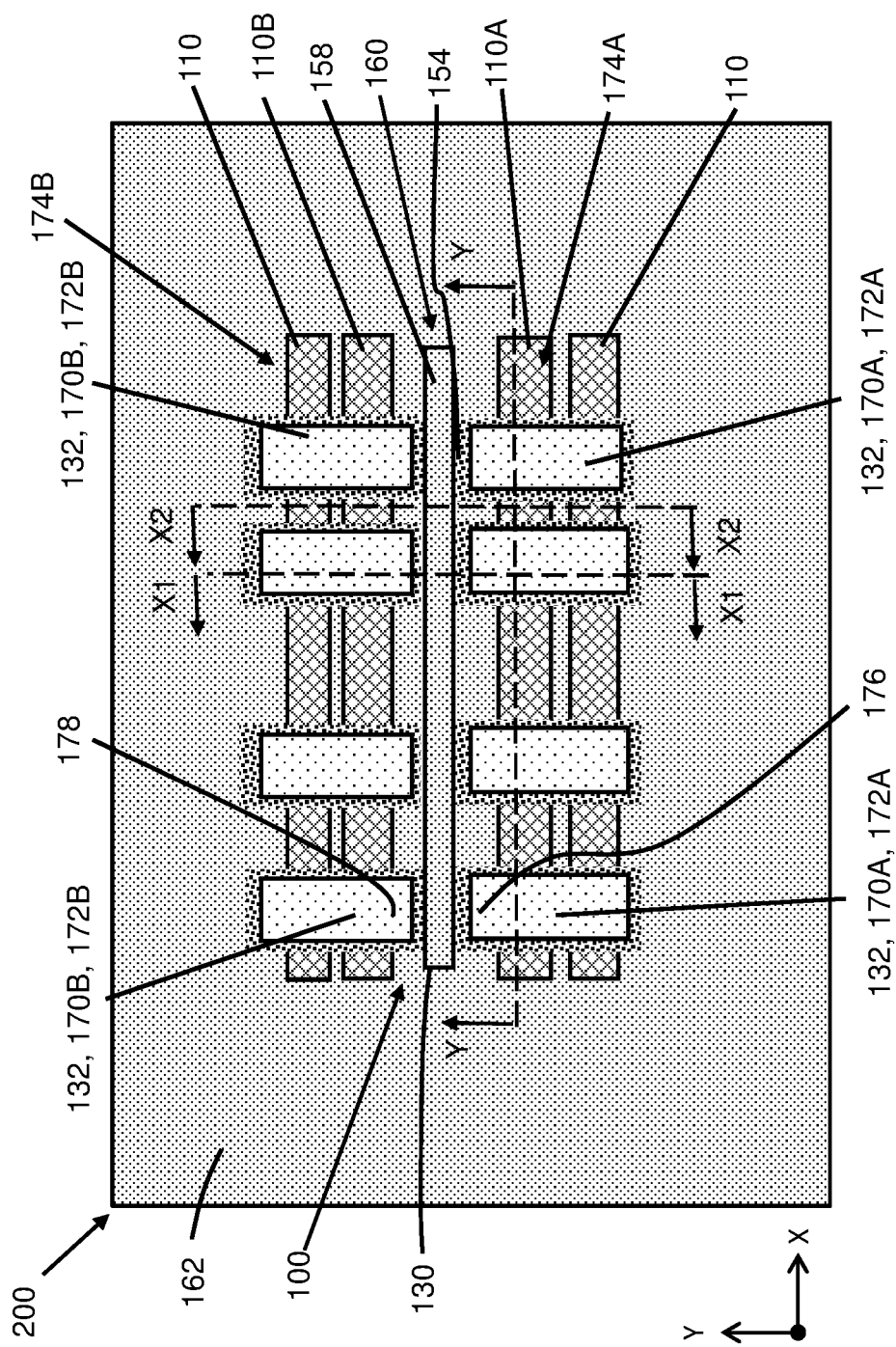
FIG. 1 shows a plan view plan view of a general layout in which a gate cut structure according to embodiments of the disclosure may be formed and used.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a gate cut structure for FETs, a related FET structure, and a related method.

The method forms a gate cut opening in a gate in a gate material layer, the gate cut opening extending into a space separating a semiconductor structures on a substrate under the gate material layer. A source/drain region is formed on the semiconductor structure(s), and a gate cut isolation is formed in the gate cut opening. During a contact forming process, a mask has a portion covering an upper end of the gate cut isolation to protect it. The gate cut structure separates and electrically isolates an end of a first metal gate conductor of a first FET from an end of a second metal gate conductor of a second FET. The gate cut structure includes a gate cut isolation including a nitride liner contacting the end of the first metal gate conductor and the end of the second metal gate conductor, and an oxide body inside the nitride liner. Using a gate cut first process in this manner, a quality gate cut structure can be formed, but with a spacing between metal gate conductors to accommodate spacing in the 7 nanometer technology node and beyond. Any residue in the bottom of the gate cut opening can be readily removed using the gate cut first approach, reducing transistor to transistor shorts. Using the contact forming process mask to protect the gate cut isolation prevents damage to the isolation, and eliminates the creation of nitride residue.

Referring to the drawings, embodiments of a method of forming a gate cut structure 100 will now be described. For purposes of description, FIG. 1 shows a plan view of a general layout in which gate cut structure 100 may be formed and used. FIG. 1 includes a cross-section view line X1-X1 in an X-direction across locations of semiconductor structures 110 and through locations of gates 172A, 172B, a cross-section view line X2-X2 in an X-direction across locations of semiconductor structures 110 and at sides of gates 172A, 172B, and a cross-section view line Y-Y in a Y-direction across locations of metal gates 172A, B, per the legend. It is noted that FIG. 1 shows certain structure that may take the form of different things during the methods described herein, e.g., the center rectangle may be a gate cut isolation 160 of gate cut structure 100, or a gate cut opening 130. In the disclosure, where necessary to differentiate between numerous structures of the same nature, alphanumerical references may be employed (e.g., 172A, 172B), and where beneficial to refer to the structures collectively, just the numerical portion of the alphanumerical reference may be employed (e.g., 172).

FIG. 2 shows a cross-sectional view along cross-section view line X1-X1 in FIG. 1. Preliminarily, as shown in FIG. 2, a first and second semiconductor structures 110 may be formed on a substrate 112. Semiconductor structures 110 run in an X-direction in the drawings—into page of FIG. 2. Substrate 112 may include but is not limited to silicon, germanium, silicon germanium, silicon carbide, and those consisting essentially of one or more III-V compound semiconductors having a composition defined by the formula $Al_{x1}Ga_{x2}In_{x3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. Semiconductor structures 110 may include any of the listed materials for substrate 112. Semiconductor structures 110 may be made using any now known or later developed technique, e.g., as fins epitaxially grown from substrate 112, or fins etched from substrate 112. Embodiments of the disclosure will be described relative to semiconductor structures 110 in the form of semiconductor fins. However, the teachings of the disclosure are equally applicable to other semiconductor structures, e.g., bulk planar semiconductor, semiconductor-on-insulator (SOI), etc. Although numerous semiconductor structures 110 are shown, a first semiconductor structure 110A and a second semiconductor structure 110B will be occasionally referenced for purposes of description of the disclosure.

As shown best in FIG. 2, a space 114 separates first and second semiconductor structures 110A, 110B. A shallow trench isolation (STI) 116 may also be formed in or on substrate 112 to electrically isolate semiconductor structures 110. Generally, STI 116 can be formed by depositing an insulating material into a trench in substrate 112 or on substrate 112 to isolate structures 110 from one another. One or more FETs (174 in FIGS. 1 and 9) of a given polarity may be disposed within an area isolated by STI 116. Each STI 116 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

FIG. 3 shows a cross-sectional view along cross-section view line Y-Y in FIG. 1. FIGS. 2 and 3 show a gate material layer 120 over semiconductor structures 110. In one embodiment, gate material layer 120 includes a sacrificial material for use in forming dummy gates 132 (FIG. 3) as part of a replacement metal gate (RMG) process. Gate material layer 120 may include any now known or later developed sacrificial materials for a dummy gate such as but not limited to: amorphous silicon or polysilicon. Gate material layer 120 may be deposited. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Gate material layer 120 may be deposited, for example, using ALD.

In accordance with embodiments of the disclosure, as shown in FIGS. 2-4, gate cut opening 130 (FIG. 4) is formed with dummy gates 132 in gate material layer 120. That is, gate cut opening 130 is formed at the same time as dummy gates 132 is formed in gate material layer 120. Dummy gates 132 generally extend in a Y-direction in the drawings. As shown in FIG. 1, each dummy gate 132 crosses over many semiconductor structures 110. Dummy gates 132 may be employed to hold a place for a later formed metal gate conductor (170A, B in FIGS. 7-9) that will replace them. Dummy gates 132 are used in place of a metal gate conductor to prevent damage to the metal gate conductor during certain processing, e.g., dopant anneals used to form source/drain regions in semiconductor structures 110. Once the potentially damaging processing is complete, as will be described, dummy gates 132 are removed and replaced with metal gate conductors that form the final metal gate (172 in FIGS. 1 and 9) of the FETs. While embodiments of the disclosure will be described relative to an RMG process, the teachings of the disclosure can be implemented with a gate first process with a gate cut opening formed in metal gates rather than dummy gates 132, and skipping the RMG process described herein.

FIGS. 2-4 show forming a gate cut opening 130 in a gate structure, e.g., dummy gate, in gate material layer 120. FIG. 2 shows forming a gate formation mask 134 over gate material layer 120, and FIGS. 3 and 4 show etching using gate formation mask 134 to form gate cut opening 130 in (and with) dummy gates 132 in gate material layer 120. Gate formation mask 134 includes a gate pattern 136 (FIG. 3) including a gate cut opening 138 over space 114 (FIG. 2 only) between first and second semiconductor structures 110A, 110B. Gate pattern 136 in gate formation mask 134 may include openings for any number of (dummy) gates 132 (FIG. 3) over semiconductor structures 110, and may include any size gates. In the example plan view in FIG. 1, four dummy gates 132 are formed with gate cut opening 130 between first and second semiconductor structures 110A, 110B. Gate formation mask 134 may include any now known or later developed mask appropriate for gate material layer 120. In the example shown, gate formation mask 134 includes a patterned photoresist 140 over a nitride hard mask 142, some of the latter of which may remain on dummy gates 132 as shown in FIG. 4. Any etching appropriate for gate material layer 120 may be employed to form dummy gate 132 and gate cut opening 130. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Dummy gate 132 and gate cut opening 130 may be etched, for example, using a RIE. As shown in FIG. 4, when the etching is complete, gate cut opening 130 is in dummy gates 132 and extends into space 114 (FIG. 2) separating first and second semiconductor structure 110A, 110B on substrate 112 under gate material layer 120. Gate cut opening 130 extends to STI 116. While gate cut opening 130 is shown as elongated to cut a number of dummy gates 132 in FIG. 1, it is recognized that it can be segmented, e.g., with a gate cut opening 130 for each dummy gate 132.

Gate cut opening 130 may have a width W1 sufficient to perform cleaning of a bottom surface 144 of gate cut opening 130 after forming of gate cut opening 130. The cleaning may remove dummy gate 132 residue (e.g., polysilicon or amorphous silicon) from bottom surface 144 of gate cut opening 130. Width W1 may be, for example, less than approximately 30 nanometers (nm), thus a gate cut isolation 160 (FIG. 9) formed in gate cut opening 130 may have a width less than approximately 30 nm. The cleaning can include any now known or later developed ashing process appropriate for gate material layer 120.

Figure 6:
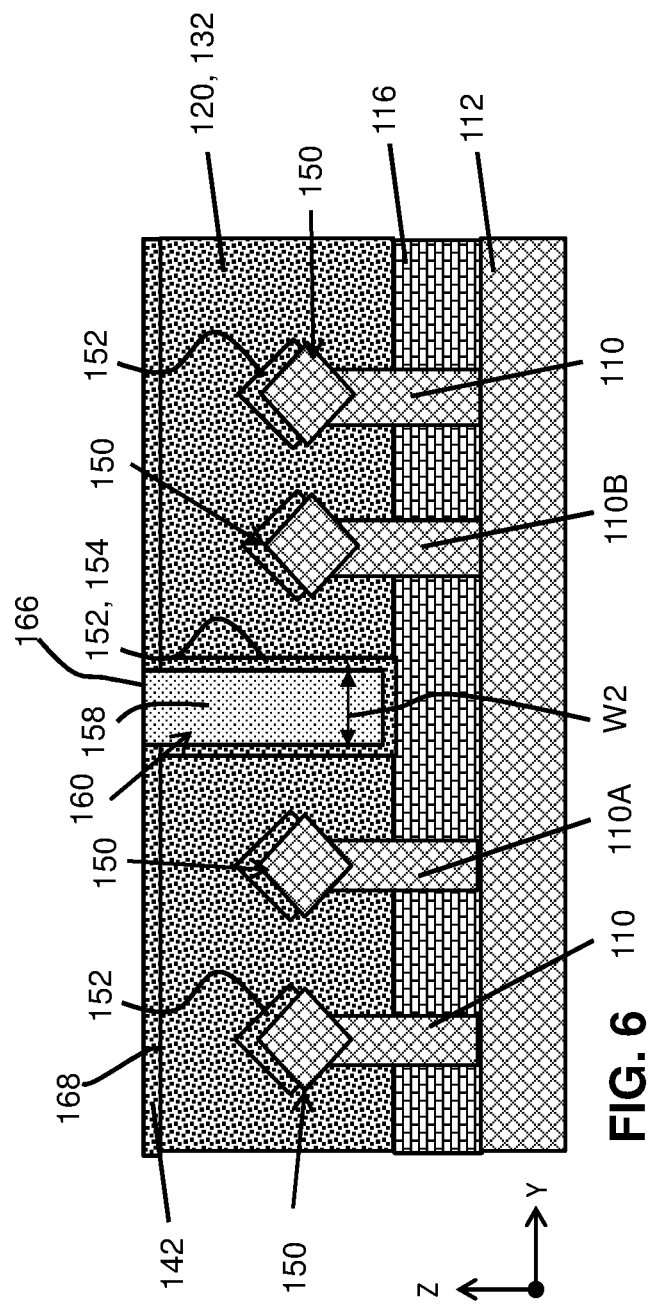
FIG. 6 shows a cross-sectional view along cross-section view line X2-X2 in FIG. 1 of forming a gate cut isolation, according to embodiments of the disclosure.
Figure 7:
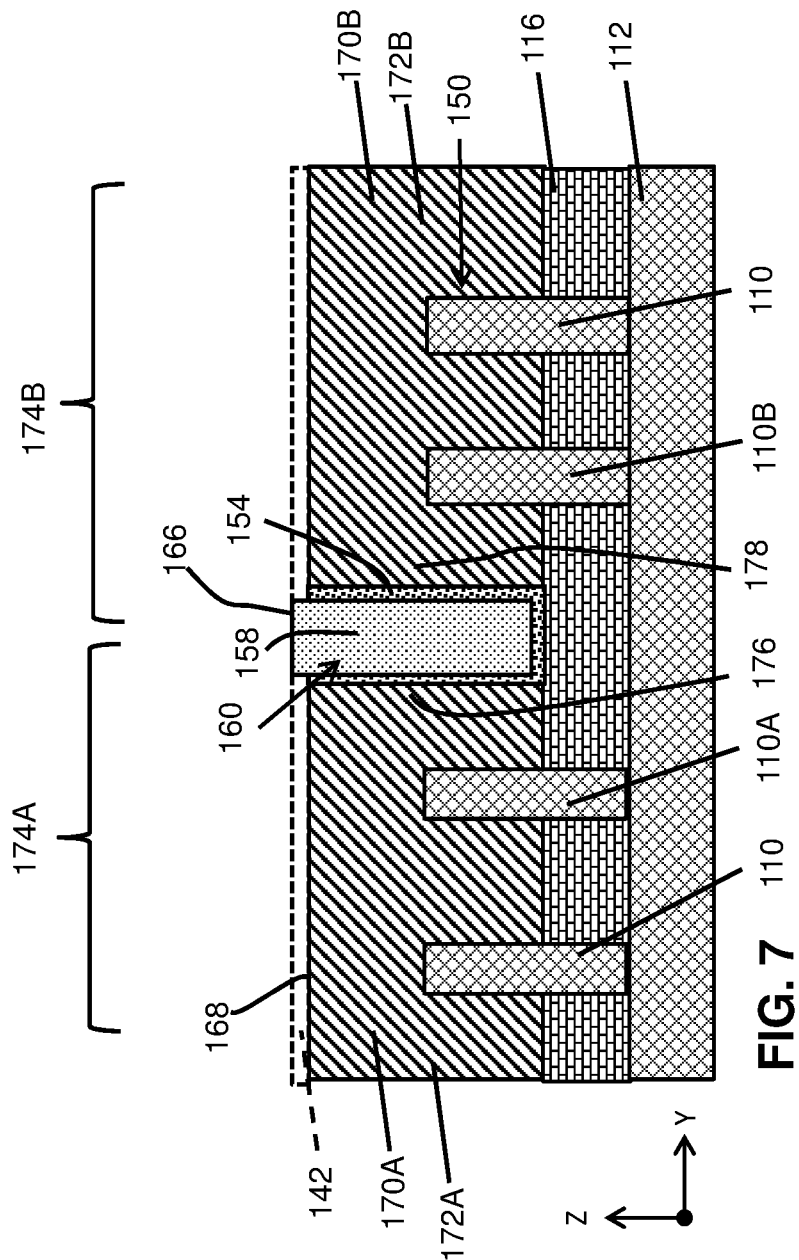
FIG. 7 shows a cross-sectional view along cross-section view line X1-X1 in FIG. 1 of performing a replacement metal gate (RMG) process, according to embodiments of the disclosure.

FIGS. 5, 6, 8 and 9 shows cross-sectional views along cross-section view line X2-X2 in FIG. 1 (note, any spacer(s) on sides of gate structures, e.g., dummy gate 132, is/are omitted); and FIG. 7 shows a cross-sectional view along cross-section view line X1-X1 in FIG. 1. At this stage, gate cut opening 130 could be completely filled with a gate cut fill such as silicon nitride. In contrast, according to embodiments of the disclosure, as shown in FIG. 5, a source/drain region 150 is formed on at least one of first and second semiconductor structures 110A, 110B. Source/drain 150 formation may include any now known or later developed process including, for example, ion implantation of a dopant, epitaxial growth on semiconductor structures 110, and annealing to drive in dopants. Notably, a final process of forming source/drain regions 150 may include forming an etch stop layer (ESL) 152 in gate cut opening 130. ESL 152 may be formed over, inter alia, source/drain regions 150 and is used to stop etching of contact openings to source/drain regions 150 (hence, it is sometimes referred to as a contact etch stop layer (CESL)). ESL 152 may include a nitride such as but not limited to silicon nitride $Si_3N_4$. ESL 152 may be deposited, e.g., using CVD, over upper surfaces of source/drain regions 150. In addition, since gate cut opening 130 is exposed, ESL 152 also covers sidewalls and bottom surface 144 of the gate cut opening, forming a nitride liner 154 therein. ESL 152 may also thicken nitride hard mask 142. Nitride liner 154 may have a thickness configured to reduce the size of gate cut opening 130, and thus a size of gate cut isolation 160 (FIG. 9) that will eventually electrically isolate ends of metal gate conductors for adjacent FETs. For example, gate cut opening 130 may have a new, smaller width W2 (FIG. 5) compared to initial width W1. Width W2 can be, for example, less than approximately 30 nm.

Referring to FIGS. 1 and 6, forming a gate cut isolation 160 in gate cut opening 130 (FIG. 5) is shown. In one embodiment, forming gate cut isolation 160 includes depositing an oxide in gate cut opening 130 (FIG. 4) over ESL 152, i.e., over nitride liner 154. More particularly, an interlayer dielectric (ILD) 162 may be formed about first and second semiconductor structures 110A, 110B and dummy gate 132, with a part of ILD 162 forming oxide body 158. That is, ILD 162 fills the spaces between first and second semiconductor structures 110 and dummy gates 132. ILD 162 is behind and in front of dummy gate 132 in FIG. 6 (in page and out of page). ILD 162 also fills gate cut opening 130 (FIG. 5), creating oxide body 158 of gate cut isolation 160. So, the oxide of ILD 162 deposits in gate cut opening 130 and deposits adjacent to dummy gate 132, see FIG. 1. ILD 162 may include any of a variety of known oxide ILD materials, but in one embodiment includes an oxide such as silicon oxide ($SiO_2$) or Tonen® SilaZene (TOSZ) oxide. In any event, gate cut isolation 160 with an oxide body 158, is formed. Other ILD materials include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). ILD 162 may be deposited using any appropriate deposition technique, e.g., ALD.

FIG. 7 shows a cross-sectional view of performing a replacement metal gate (RMG) process along line X1-X1 in FIG. 1, i.e., through gate locations. As noted, gate material layer 120 (FIG. 6) includes a sacrificial material, e.g., amorphous silicon, for creating dummy gate 132. At this stage, dummy gates 132 are replaced with a metal gate conductor 170 (two metal gate conductors 170A, 170B shown), forming metal gates 172A, B of FETs 174A, 174B, respectively. This process may include removing nitride hard mask 142 (shown in dashed lines to illustrate removal) over just dummy gates 132, etching out gate material layer 120 (FIG. 6) in areas where dummy gate 132 exists, e.g., with a RIE in a known fashion, depositing metal gate conductor 170, planarizing to remove any excess metal, and replacing nitride hard mask 142 over metal gate conductor 170. A mask (not shown) used to remove dummy gates 132 may cover gate cut isolation 160 protect it from the etching to remove dummy gates 132. While shown as a single material, metal gate conductors 170A, B may include one or more dielectric and conductive components for providing a metal gate terminal of a transistor. For example, metal gate conductors 170A, B may include a work function metal (WFM) layer and a gate conductor. The WFM layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor may include any now known or later developed gate conductor such as copper (Cu). Other layers such as a gate dielectric layer and/or a dielectric spacer layers may also be formed in the gate opening prior to the metal gate conductor 170.

As shown in FIG. 7, gate cut isolation 160 isolates metal gate conductor 170A over first semiconductor structure 110A from metal gate conductor 170B over second semiconductor structure 110B, i.e., it separates metal gate 172A of first FET 174A from metal gate 172B of second FET 174B. It is noted that nitride liner 154 contacts end 176 of first metal gate conductor 170A and end 178 of second metal gate conductor 170B. Oxide body 158 is inside nitride liner 154.

Figure 8:
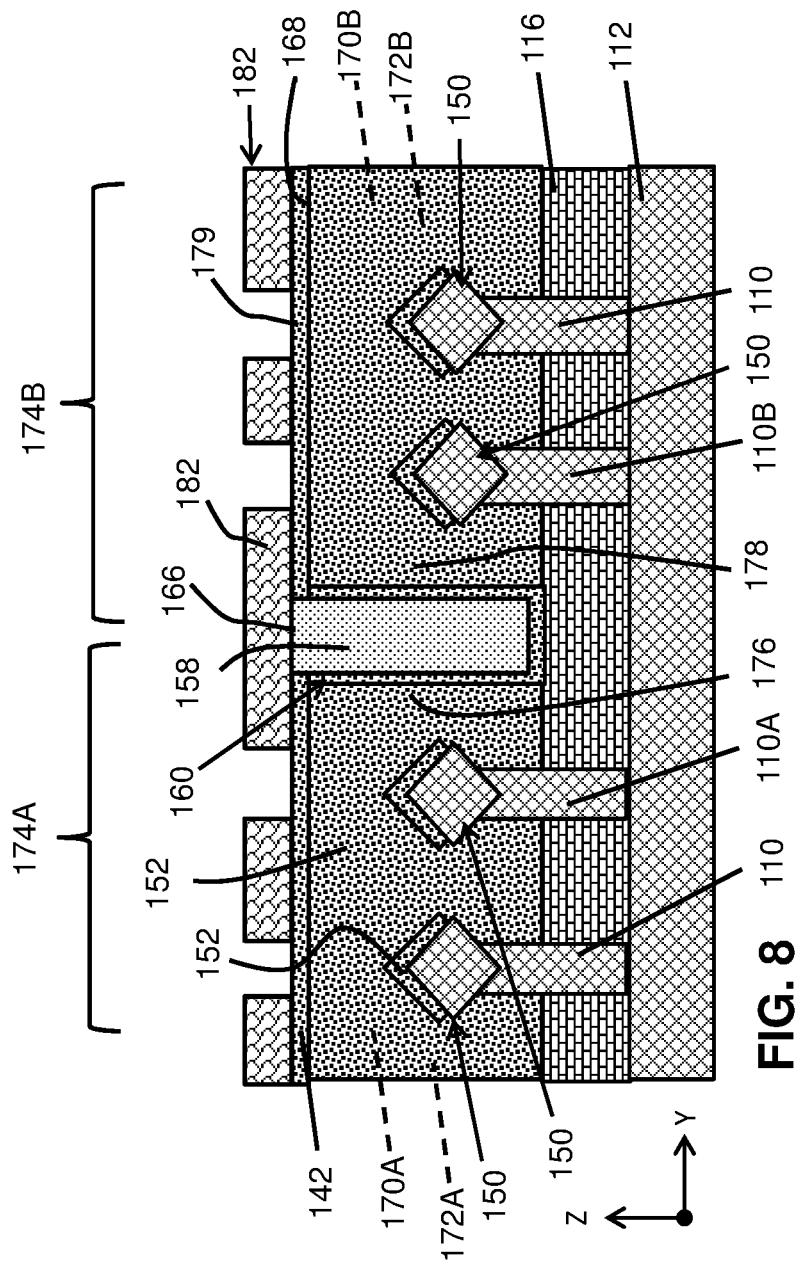
FIG. 8 shows a cross-sectional view along cross-section view line X2-X2 in FIG. 1 of part of a contact forming process, according to embodiments of the disclosure.
Figure 9:
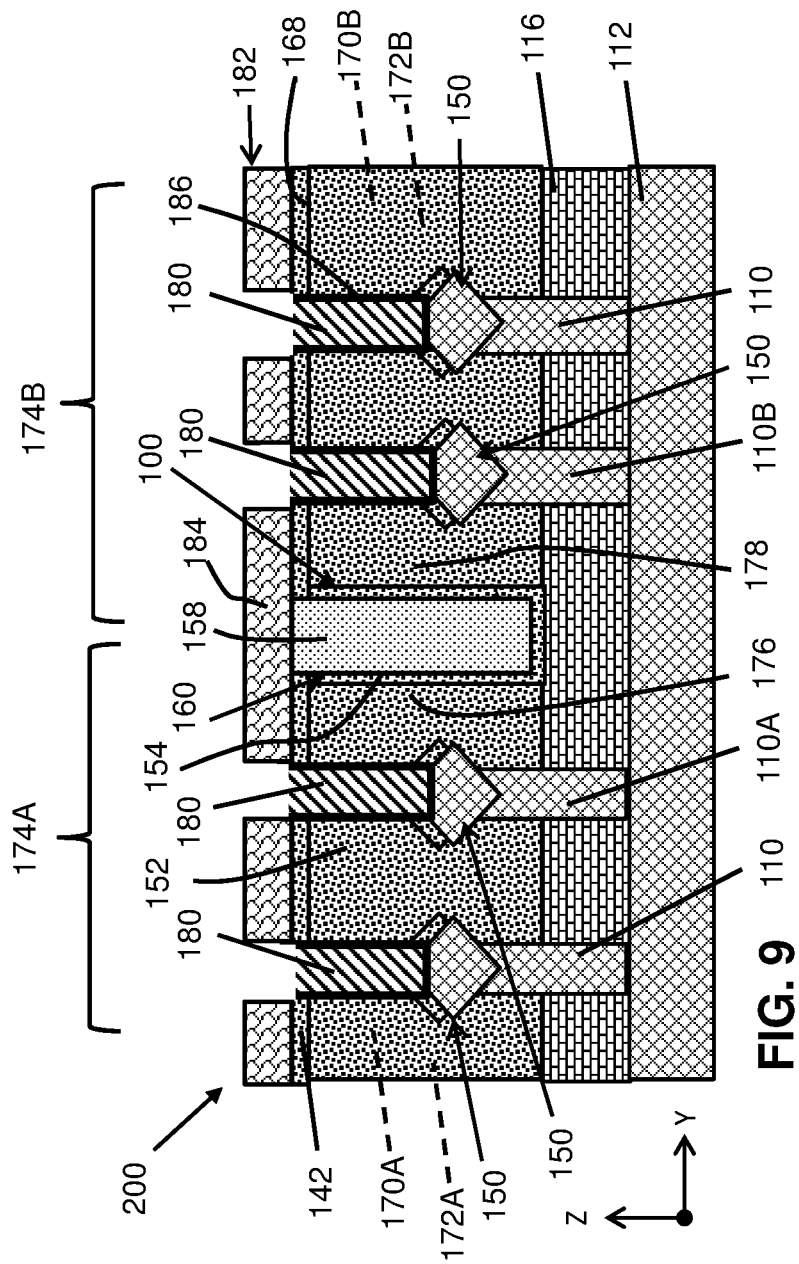
FIG. 9 shows a cross-sectional view along cross-section view line X2-X2 in FIG. 1 of another part of the contact forming process.

FIGS. 8 and 9 show forming a contact 180 (FIG. 9) to source/drain region(s) 150. Note, since FIGS. 8 and 9 show a cross-sectional view along line X2-X2 in FIG. 1, gate conductors 170A, 170B and metal gates 172A, 172B are labeled in phantom behind ESL 152 on sides thereof. Where gate cut isolation 160 includes a nitride body, contiguous to nitride hard mask 142, the process to form contacts to source/drain regions 150 could proceed with normal impact to gate cut isolation 160, e.g., with formation of some nitride residue that could impact other etching processes. However, as shown best in FIG. 8, an upper end 166 of oxide body 158 of gate cut isolation 160 extends above an upper end 168 of each of metal gates 172A, 172B, e.g., to an upper surface 179 of nitride hard mask 142. To protect oxide body 158, the contact forming may include using a mask 182 having a portion 184 covering upper end 166 of gate cut isolation 160. Mask 182 may include any now known or later developed middle-of-line trench silicide (TS) mask, which may vary depending on technology node. For example, certain technology nodes may use a separate mask, e.g., an oxide trench block (TB) mask, but other technology nodes may use a number of interacting masks parts of which may be blocking. In any event, portion 184 of mask 182 protects oxide body 158 by blocking etching of gate cut isolation 160 during the contact opening etch of the contact forming process. The etching process may include any appropriate etching processes for the materials to be etched. For example, the etching processes may include a first etch (e.g., a RIE) opening contact openings 186 (FIG. 9) to ESL 152 over source/drain regions 150, i.e., it removes nitride hard mask 142 and ILD 162 to ESL 152. The etching process may also include a second etch (e.g., a wet etch) that may punch through ESL 152 to source/drain regions 150. A conductor may be deposited into openings 186 (FIG. 9) to form contacts 180 (FIG. 9). The contact conductor may include, for example, a refractory metal liner (thick border) such as ruthenium (Ru), tantalum (Ta), titanium (Ti), tungsten (W), iridium (Jr), rhodium (Rh) and platinum (Pt), etc., or mixtures of thereof. The contact conductor may also include a body metal such as tungsten (W). Any excess conductor may be removed using a planarization step (not shown).

With reference to FIGS. 1 and 9, embodiments of the disclosure also include a FET structure 200 including gate cut structure 100. FET structure 200 includes substrate 112 with first FET 174A on substrate 112, and second FET 174B on substrate 112. First FET 174A has a first semiconductor structure 110A and a first metal gate conductor 170A over first semiconductor structure 110, creating first metal gate 172A; and second FET 174B has second semiconductor structure 110B and second metal gate conductor 170B over second semiconductor structure 110B, creating second metal gate 172B. As shown best in FIG. 1, ILD 162 is positioned about first FET 174A and second FET 174B. Gate cut structure 100 electrically isolates end 176 of first metal gate conductor 170A of first FET 174A from end 178 of second metal gate conductor 170B of second FET 174B. Gate cut structure 100 includes oxide body 158 inside nitride liner 154. Nitride liner 154 contacts end 176 of first metal gate conductor 170A and end 178 of second metal gate conductor 170B, and the nitride liner. As shown in FIGS. 1 and 9, nitride liner 154 separates oxide body 158 from end 176 of first metal gate conductor 170A, and separates oxide body 158 from end 178 of second metal gate conductor 170B. As shown best in FIG. 9, nitride liner 154 also extends between oxide body 158 and STI 116 below gate cut structure 100, i.e., the nitride liner 154 covers a bottom of oxide body 158. Gate cut structure 100 also has upper end 166 of oxide body 158 extending above upper end 168 of each of first and second metal gate conductors 170A, 170B.

Embodiments of the disclosure provide a gate cut first process that allows for cleaning of a wider gate cut opening than gate cut last processes, allowing for a quality gate cut structure to be formed, but with a width to accommodate spacing in the 7 nanometer technology node and beyond. Embodiments of the disclosure thus can improve device performance by cut isolation size to meet current and future size assumptions. Any residue in the bottom of the gate cut opening can be readily removed using the gate cut first approach, reducing transistor to transistor shorts. Using the contact forming process mask to protect the gate cut isolation prevents damage to the isolation, and eliminates the creation of nitride residue without the use of any additional masks.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate+/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method, comprising:
    forming a gate cut opening in a gate structure in a gate material layer, the gate cut opening extending into a space separating a first and second semiconductor structures on a substrate under the gate material layer;
    forming a source/drain region on at least one of the first and second semiconductor structures;
    forming a gate cut isolation in the gate cut opening; and
    forming a contact to at least one of the source/drain regions, the contact forming including using a mask having a portion covering an upper end of the gate cut isolation, wherein the gate cut isolation includes:
        a nitride liner, and
        an oxide body inside the nitride liner, wherein an upper end of the oxide body extends above an upper end of each of the first and second semiconductor structures.

2. The method of claim 1, wherein the forming the source/drain region on the first and second semiconductor structures includes forming an etch stop layer (ESL) in the gate cut opening.

3. The method of claim 2, wherein the forming the gate cut isolation includes depositing an oxide in the gate cut opening over the ESL.

4. The method of claim 2, wherein the ESL includes a nitride.

5. The method of claim 1, wherein the forming the gate cut isolation includes depositing an oxide in the gate cut opening.

6. The method of claim 5, wherein the mask having the portion over the upper end of the gate cut isolation during the forming of the contact protects the oxide of the gate cut isolation.

7. The method of claim 5, wherein the depositing the oxide in the gate cut opening also includes depositing the oxide adjacent to the gate structure.

8. The method of claim 1, wherein the forming of the gate cut opening in the gate structure in the gate material layer includes:
    forming a gate formation mask over the gate material layer, the gate formation mask including a gate pattern including a gate cut opening over the space between the first and second semiconductor structures; and
    etching to form the gate cut opening.

9. The method of claim 1, wherein the gate material layer includes a sacrificial material for creating a dummy gate, and further comprising replacing the dummy gate with a metal gate conductor,
    wherein the gate cut isolation isolates the metal gate conductor over the first semiconductor structure from the metal gate conductor over the second semiconductor structure.

10. The method of claim 1, further comprising performing a cleaning of a bottom surface of the gate cut opening after the forming of the gate cut opening.

11. A field effect transistor (FET) structure, comprising:
a substrate;
a first FET on the substrate, the first FET having a first semiconductor structure and a first metal gate conductor over the first semiconductor structure;
a second FET on the substrate, the second FET having a second semiconductor structure and a second metal gate conductor over the second semiconductor structure; and
a gate cut structure electrically isolating an end of the first metal gate conductor of the first FET from an end of the second metal gate conductor of the second FET,
wherein the gate cut structure includes:
a nitride liner contacting the end of the first metal gate conductor and the end of the second metal gate conductor, and
an oxide body inside the nitride liner, wherein an upper end of the oxide body extends above an upper end of each of the first and second metal gate conductors.

12. The FET structure of claim 11, wherein the nitride liner extends between the oxide body and a shallow trench isolation below the gate cut structure.

13. The FET structure of claim 11, wherein the oxide body is part of an interlayer dielectric (ILD) positioned about the first FET and the second FET.

14. The FET structure of claim 11, wherein the gate cut structure has a width less than approximately 30 nanometers.

15. A gate cut structure for field effect transistors (FETs), the gate cut structure comprising:
a gate cut isolation electrically isolating an end of a first metal gate conductor of a first FET from an end of a second metal gate conductor of a second FET,
wherein the gate cut isolation includes a nitride liner contacting the end of the first metal gate conductor and the end of the second metal gate conductor, and an oxide body inside the nitride liner, wherein the nitride liner extends between the oxide body and a shallow trench isolation below the gate cut structure.

16. The gate cut structure of claim 15, wherein an upper end of the oxide body extends above an upper end of each of the first and second metal gate conductors.

17. The gate cut structure of claim 15, wherein the oxide body is part of an interlayer dielectric (ILD) positioned about the first FET and the second FET.

18. The gate cut structure of claim 15, wherein the gate cut isolation has a width less than approximately 30 nanometers.

* * * * *